(12) United States Patent
Walker et al.

(10) Patent No.: US 6,960,794 B2
(45) Date of Patent: Nov. 1, 2005

(54) FORMATION OF THIN CHANNELS FOR TFT DEVICES TO ENSURE LOW VARIABILITY OF THRESHOLD VOLTAGES

(75) Inventors: Andrew J. Walker, Mountain View, CA (US); S. Brad Herner, San Jose, CA (US); Maitreyee Mahajani, Saratoga, CA (US); En-Hsing Chen, Sunnyvale, CA (US); Roy E. Scheuerlein, Cupertino, CA (US); Sucheta Nallamothu, San Jose, CA (US); Mark Clark, Leuven (BE)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/334,649

(22) Filed: Dec. 31, 2002

(65) Prior Publication Data

US 2004/0124415 A1 Jul. 1, 2004

(51) Int. Cl.[7] ................................................. H01L 29/76
(52) U.S. Cl. ....................... 257/213; 257/311; 257/411; 257/640; 257/649
(58) Field of Search ................................. 257/184, 187, 257/203, 221, 315–318, 365, 213, 311, 411, 640, 649

(56) References Cited

U.S. PATENT DOCUMENTS

| | | | | |
|---|---|---|---|---|
| 5,229,631 A | | 7/1993 | Woo | |
| 5,548,132 A | * | 8/1996 | Batra et al. | 257/66 |
| 5,693,959 A | * | 12/1997 | Inoue et al. | 257/66 |
| 6,093,577 A | * | 7/2000 | van der Groen et al. | 438/30 |
| 6,413,838 B2 | * | 7/2002 | Itoh | 438/462 |
| 6,420,219 B2 | | 7/2002 | Batra et al. | |
| 6,646,300 B2 | * | 11/2003 | Ishii et al. | 257/316 |
| 6,677,204 B2 | * | 1/2004 | Cleeves et al. | 438/268 |

OTHER PUBLICATIONS

Hodges et al., Analysis and Design of Digital Integrated circuits, 2 ed, p. 30–34.*

Miyasaka, Mitsutoshi.,et al. , "Effects of Semiconductor Thickness on Poly–Crystalline Silicon Thin Film Transistors", *Jpn. J. Appl. Phys. vol. 35 (1996) Part 1, No. 2B*, (Feb. 1996),923–929.

* cited by examiner

Primary Examiner—Long Pham
Assistant Examiner—Wai-Sing Louie
(74) Attorney, Agent, or Firm—Matrix Semiconductor, Inc.; Pamela J. Squyres

(57) ABSTRACT

A thin film transistor with a channel less than 100 angstroms thick, preferably less than 80 angstroms thick, preferably less than 60 angstroms thick. The very thin channel reduces variability of threshold voltage from one TFT to the next. This is particularly advantageous for TFT memory arrays. It is possible that an extremely thin channel restricts the size of grains, forcing many small grains to be formed.

21 Claims, 6 Drawing Sheets

FORMATION OF THIN CHANNELS FOR TFT DEVICES TO ENSURE LOW VARIABILITY OF THRESHOLD VOLTAGES

BACKGROUND OF THE INVENTION

The invention relates to thin film transistors (TFTs), and a novel method to minimize variability of threshold voltages across a TFT array.

In TFT memory devices, programmed and erased memory cells are distinguished by their different threshold voltages. Each cell has a higher threshold voltage when programmed than when erased. When there is too much variation of threshold voltage across an array, however, it may become difficult to distinguish erased cells from programmed cells. There is a need, therefore, to decrease variability of threshold voltages across a TFT array.

SUMMARY OF THE INVENTION

The present invention is defined by the following claims, and nothing in this section should be taken as a limitation on those claims. In general, the invention is directed to thin film transistors with low variability of threshold voltages.

A preferred embodiment provides for a thin film transistor comprising a channel region wherein the channel region is 100 angstroms thick or less. Another preferred embodiment provides for an array comprising at least one of such transistors. Yet another embodiment provides for a set of thin film transistors over a substrate, the set comprising at least one thousand thin film transistors, wherein the threshold voltages of all of the thin film transistors fall within a range of 300 millivolts.

Other preferred embodiments are provided, and each of the preferred embodiments can be used alone or in combination with one another.

The preferred embodiments will now be described with reference to the attached drawings.

DETAILED DESCRIPTION OF THE INVENTION

Figure 1:
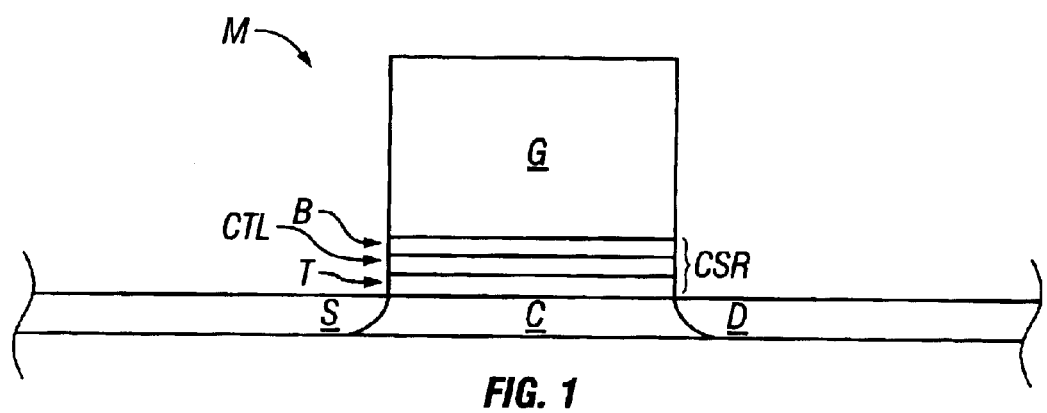
FIG. 1 illustrates a TFT according to the present invention.

TFT devices are created in a thin film, typically of polycrystalline silicon (polysilicon), over a substrate, which may be glass, plastic, a monocrystalline silicon wafer, or some other material. If a TFT includes a charge storage region, such as a floating gate, or a charge-trapping layer between two dielectric layers as in a SONOS device, or electrically isolated charge-trapping nanocrystals, it can serve as a memory cell. FIG. 1 illustrates a TFT memory cell M. TFT memory cell M consists of source S, drain D, channel region C, gate G, and charge storage region CSR, in this embodiment comprising an oxide-nitride-oxide sandwich. The oxide-nitride-oxide sandwich consists of, from the bottom up, a tunnel oxide T; the nitride layer, which is a charge trapping layer CTL; and a blocking oxide B. It will be understood that other dielectric materials may be used instead, and additional layers may be included.

To program the memory cell, a programming voltage $V_{PP}$ is applied to gate G while source S and drain D are grounded. Charge carriers tunnel through the tunnel oxide T and are trapped in the nitride charge trapping layer CTL.

To read the cell, a small voltage $V_{DS}$ is applied between source and drain, and voltage to the gate $V_G$ is ramped until the threshold voltage $V_T$ is reached and the transistor begins to conduct. The presence of trapped electrons in the charge trapping layer CTL repels electrons from the inversion layer, causing the threshold voltage $V_T$ to be higher for a programmed cell than for an erased cell. This difference in $V_T$ is how a programmed cell is distinguished from an erased or unprogrammed cell.

Figure 2A:
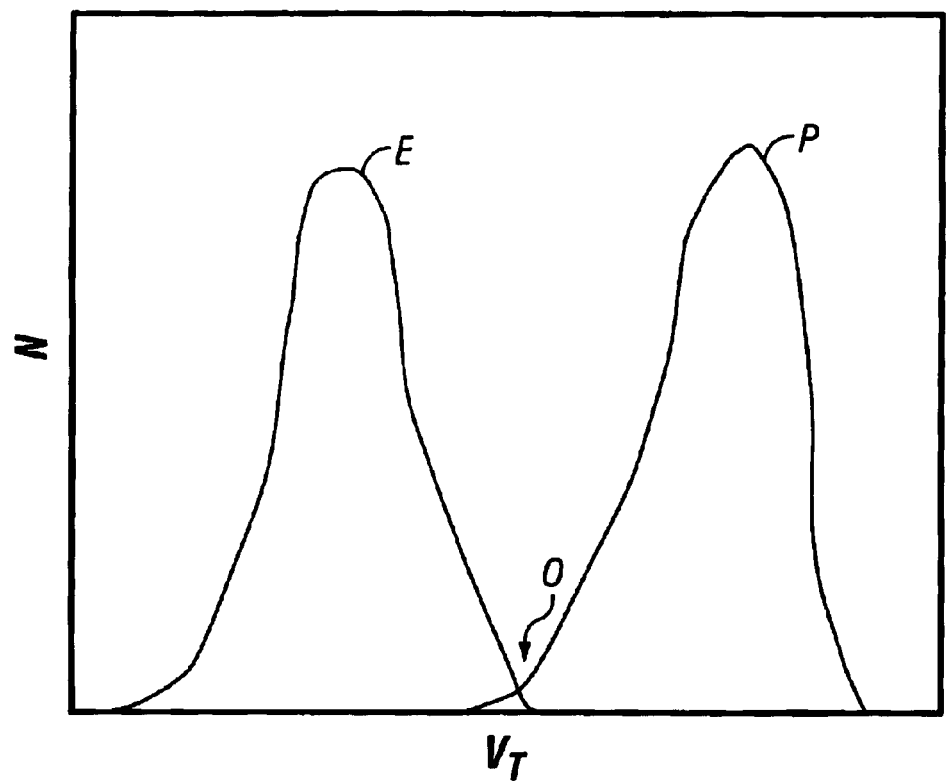
FIG. 2a and FIG. 2b are plots of threshold voltages of TFT memory cells in erased and programmed states.

A problem arises in the existence of variability of $V_T$ between cells across a memory array. FIG. 2a illustrates the distribution of threshold voltages of all the cells in a memory array in the erased and programmed states where substantial variability exists. The Y-axis indicates the number of cells with a given threshold voltage $V_T$ in an erased state E or programmed state P. In region O, the curves overlap. Cells with high $V_T$ in an erased state may have the same threshold voltage as cells with low $V_T$ in a programmed state, and cannot be distinguished by a read operation.

Figure 2B:
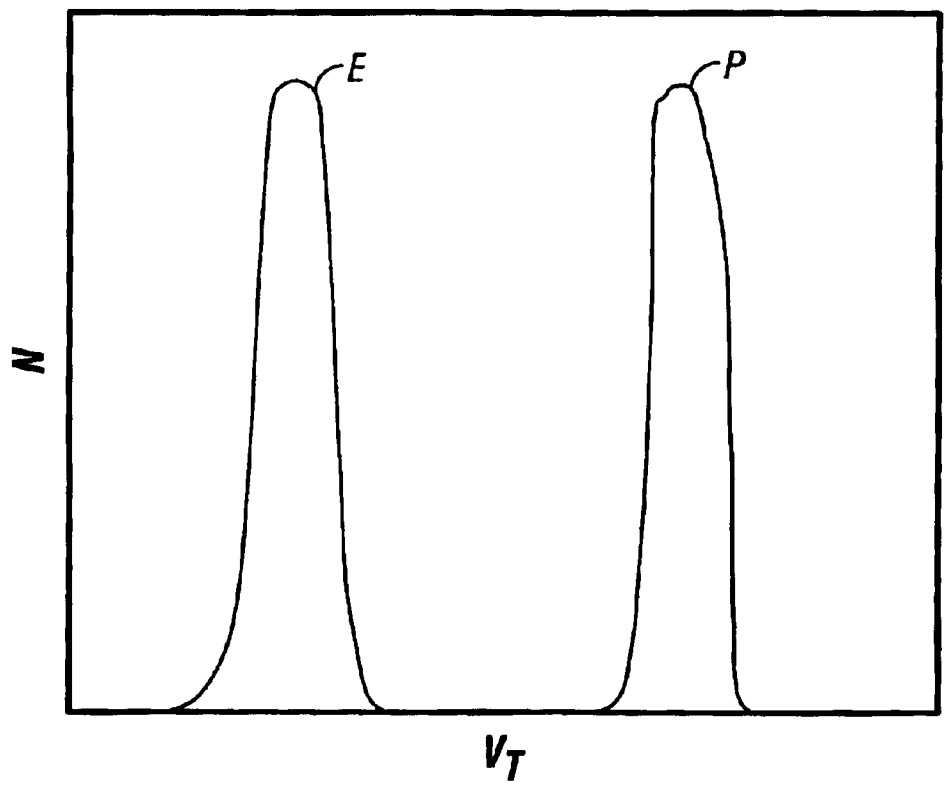

If the threshold voltages of the cells in an array are instead as shown in FIG. 2b, with no overlap between $V_T$ of erased and programmed cells, then no such ambiguity exists. A need exists, then, to reduce variability of $V_T$ across an array. One source of variability of $V_T$ is the number of grain boundaries in the channel of a transistor. A way to decrease the variability between cells caused by differing number of grain boundaries between transistors is to decrease the size of grains, thus increasing the number of grains, and the number of grain boundaries, that make up the channel. The difference between, for example, five grains in one channel and six grains in another is substantial, while the difference between, for example, 100 grains in one channel and 101 grains in another is much less so. An array made up of transistors with channels composed of more, smaller grains will show less variability of $V_T$ across the array than one composed of fewer, larger grains.

Figure 3:
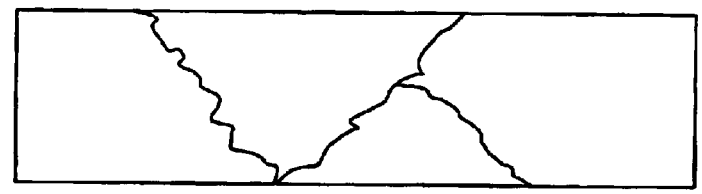
FIG. 3 illustrates possible grain sizes at different channel thicknesses.
Figure 3:
Figure 3:
Figure 3:

Although the mechanism at work is not entirely clear, the size of grains appears to be limited by limiting the thickness of the channel. A channel 100 angstroms thick or less, preferably 80 angstroms or less, and more preferably 60 angstroms or less, may serve to limit the size of grains to the thickness of the channel, increasing the number of grains in the channel, thus decreasing variability of threshold voltage across a TFT array. FIG. 3 illustrates possible grain sizes with decreasing channel thickness. As will be clear to those skilled in the art, these illustrations are merely intended to suggest the effect of decreasing channel thickness on grain size, and cannot show actual or relative size, shape, or number of grains.

Figure 4A:
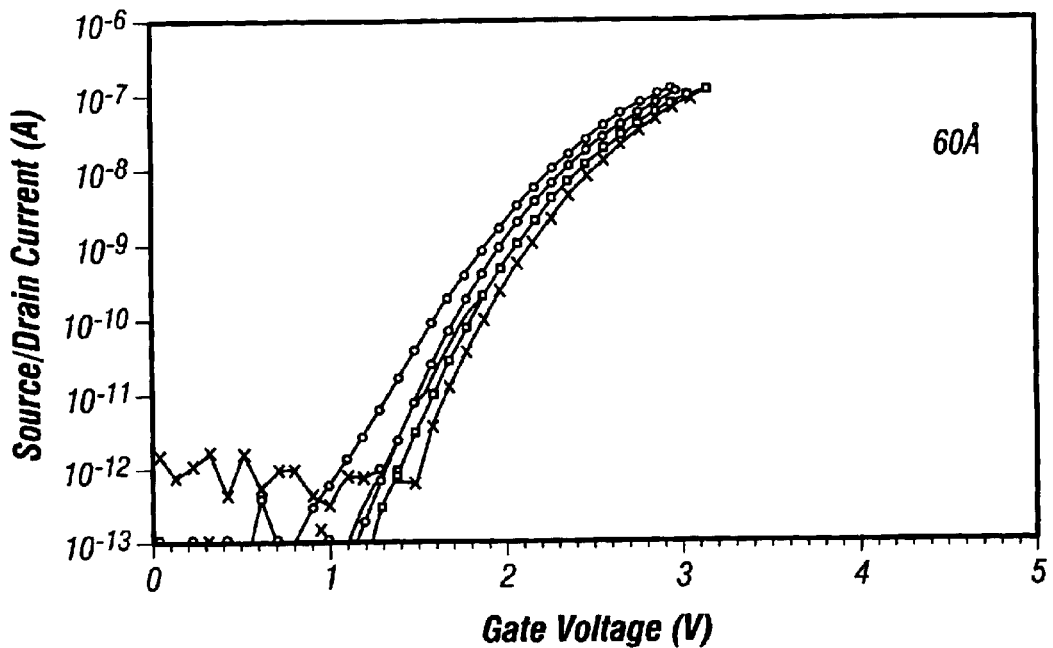
FIGS. 4a, 4b, and 4c show current vs. voltage for TFTs with channels about 60, about 160 and about 460 angstroms thick.
Figure 4B:
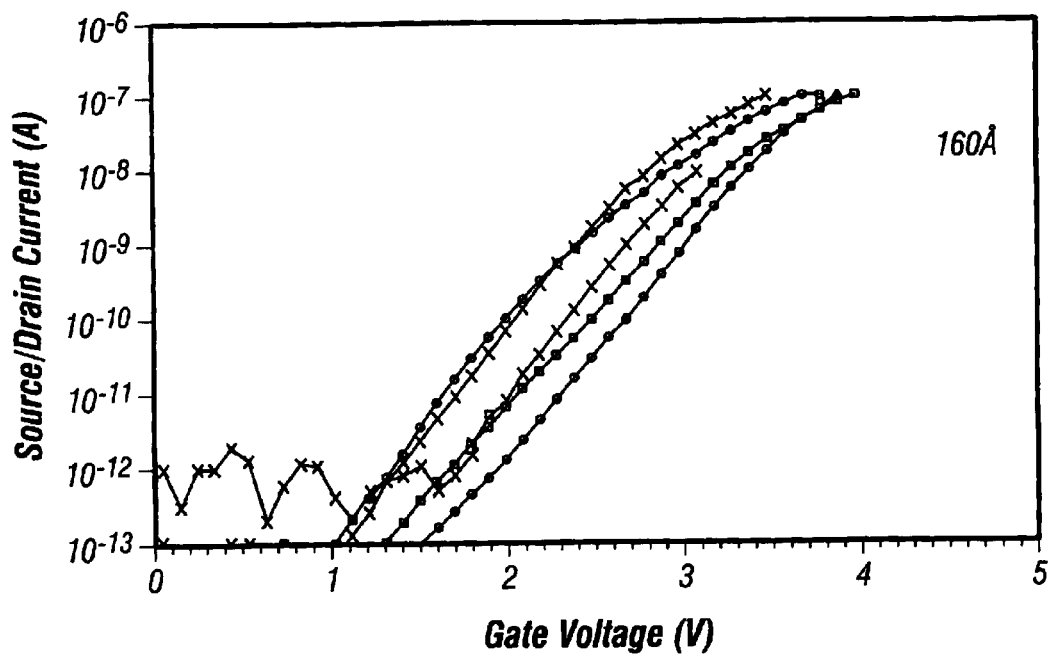
Figure 4C:
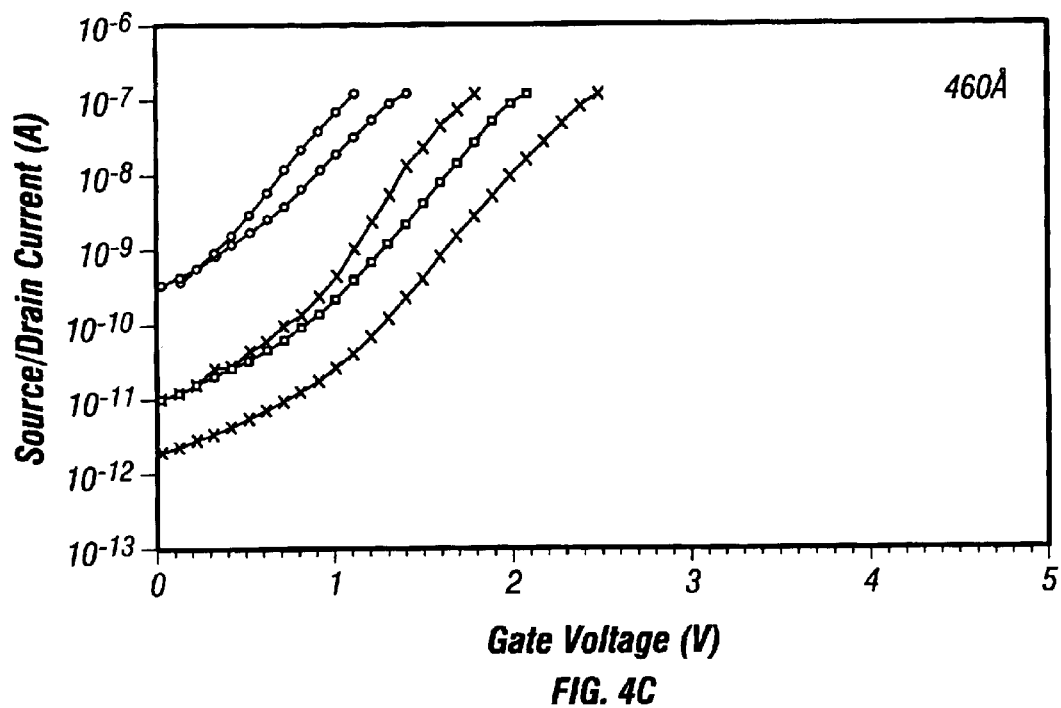

FIGS. 4a through 4c shows plots of current vs. voltage for transistors with channels about 60 angstroms (FIG. 4a), about 160 angstroms (FIG. 4b), and about 460 angstroms (FIG. 4c) thick. It will be seen that for a channel 460 angstroms thick, the gate voltages ($V_G$) required to achieve a current of $1.0 \times 10^{-7}$ amps range from about 1000 to about 2500 millivolts, a range of about 1500 millivolts. For a channel about 160 angstroms thick, the same current is produced by voltages from about 3500 millivolts to about 4000 millivolts, a range of about 500 millivolts. For a channel about 60 angstroms thick, again for a current of $1.0 \times 10^{-7}$ amps, the voltage ranges from about 2900 millivolts to about 3100 millivolts, a range of about 200 millivolts. Decreasing channel thickness decreases variability in the relationship of voltage to current, and thus the variability of threshold voltage. The profiles shown are taken across a wafer composed of many die. Variability of threshold voltage on a single die will be less than across the wafer, and thus less than in the current vs. voltage plots shown.

Figure 5A:
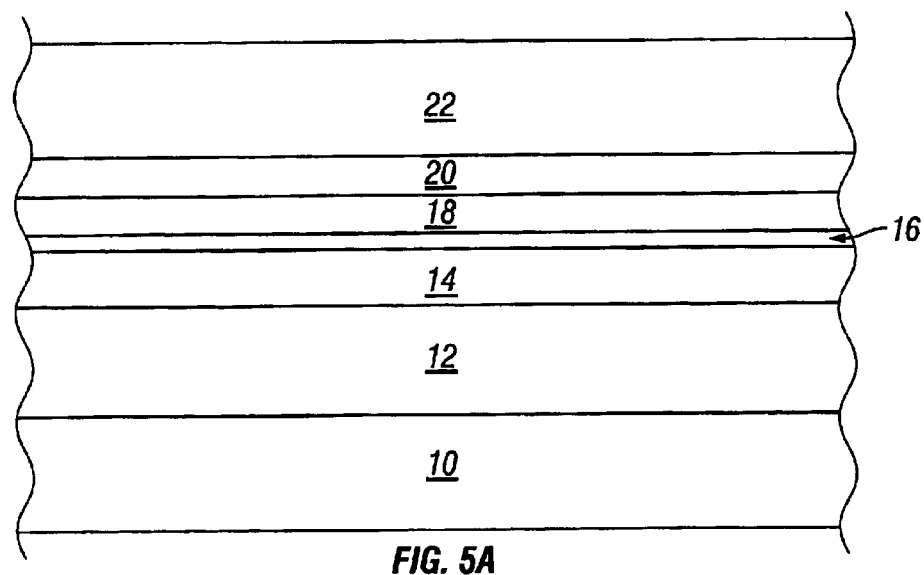
FIGS. 5a and 5b illustrate fabrication of one embodiment of the present invention.

An array of cells like memory cell M pictured in FIG. 1 can be fabricated using any TFT CMOS techniques. Two embodiments will be described, though it will be understood that many others are possible. Turning to FIG. 5a, in preferred embodiments the memory array is created over a monocrystalline silicon wafer 10 with a layer of dielectric 12 over it. This dielectric is preferably a deposited oxide (though it may be thermally grown instead) that may range from hundreds to thousands of angstroms thick. Next a thin layer of amorphous silicon or polysilicon 14 can be deposited using any deposition technique. Forming a very thin amorphous or polycrystalline silicon layer can be done using conventional equipment and methods, for example low pressure chemical vapor deposition (LPCVD) at low temperature (350 to 600 degrees C.) for slow deposition. The final thickness should be 100 angstroms or less, preferably 80 angstroms or less, and more preferably 60 angstroms or less. If the tunnel oxide to be formed over amorphous silicon layer 14 is thermally grown (discussed below), about 30 to 50 angstroms will be lost through subsequent oxidation, so deposition thickness should be adjusted accordingly.

Amorphous silicon films that are annealed to become polycrystalline silicon films, or deposited polysilicon films that are not intentionally doped, tend to be intrinsically slightly N-type. Source and drain regions will be created later in this layer through dopant implantation. If the source and drain regions are to be heavily doped N-type, a channel which is unintentionally slightly N-type can compromise device performance. In these instances, the amorphous or polycrystalline silicon film can be intentionally lightly P-doped instead.

The amorphous silicon can be crystallized to polysilicon using an annealing technique such as rapid thermal anneal, for example at 770 degrees C. for sixty seconds, or a longer anneal at 580 degrees for twenty-four hours. Next the tunnel dielectric 16 is created, preferably 20 to 30 angstroms of $SiO_2$, which can be grown or deposited using any conventional technique. Above this is formed a charge trapping layer 18, preferably a nitride layer of 90 angstroms. Next is a blocking dielectric 20, preferably an oxide layer 60 angstroms thick. The charge trapping layer 18 and the blocking dielectric 20 can be deposited using any deposition method, for example LPCVD.

Next the gate semiconductor material 22, preferably polysilicon, is deposited. It can either be deposited as polysilicon or deposited as amorphous silicon and crystallized later. The gate polysilicon is either $N^+$ or $P^+$ doped, and can either be in situ doped or deposited undoped, then implanted with dopants.

Figure 5B:
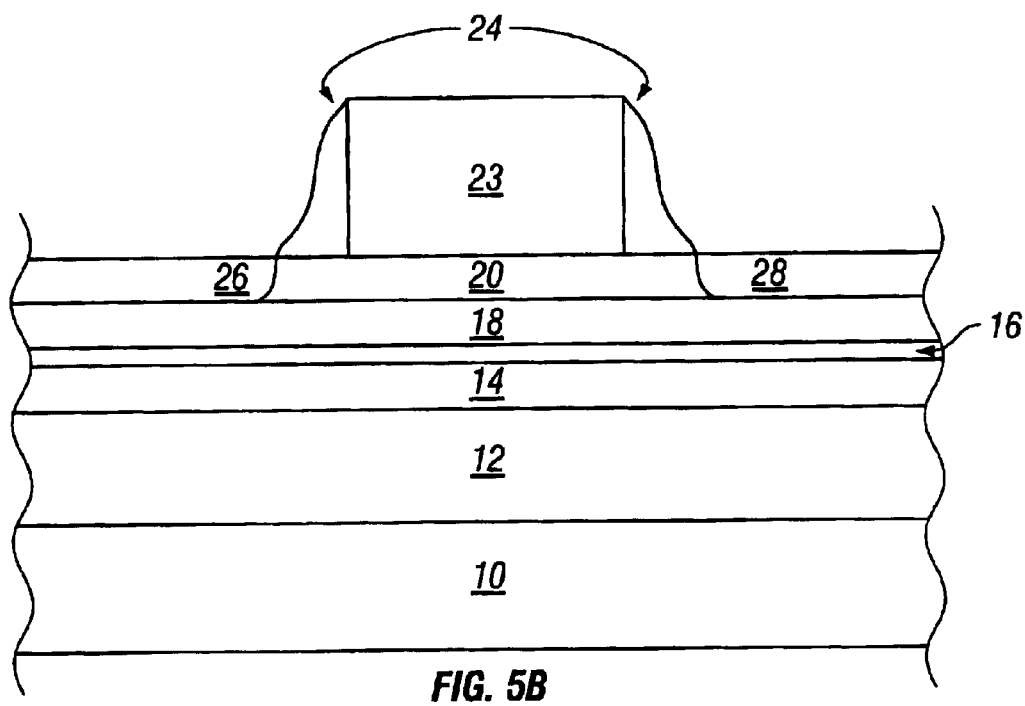

Turning to FIG. 5b, the gate 23 is patterned and etched using any photolithographic technique. Dielectric spacers 24, usually of oxide or nitride, may be formed, preferably deposited through a conformal deposition process, then etched using an anisotropic etch. Finally, source and drain regions 26 and 28 are implanted with either N-type dopants to create $N^+$ regions, or P-type dopants to create $P^+$ regions.

Figure 6A:
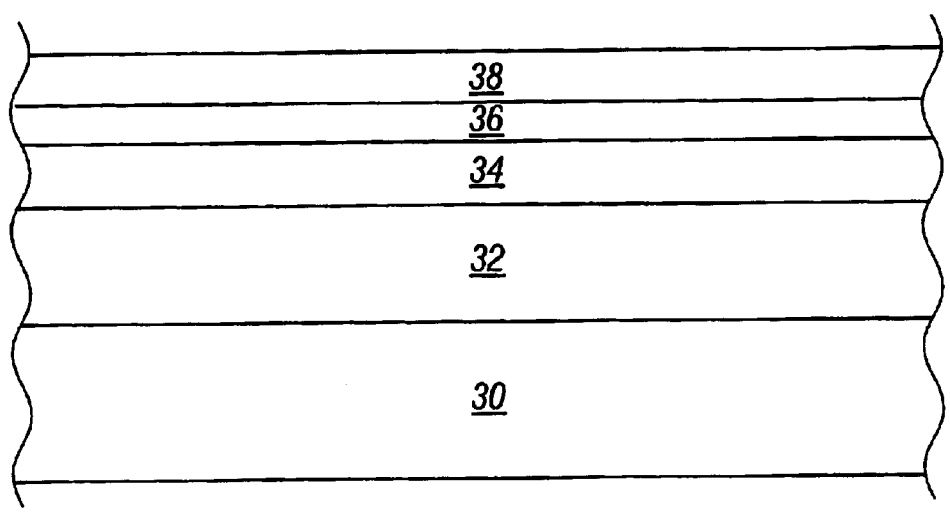
FIGS. 6a, 6b, and 6c illustrate fabrication of another embodiment of the present invention.

Turning to FIG. 6a, another embodiment will be described. This embodiment begins with a monocrystalline silicon wafer 30 and a layer of oxide 32, ranging from hundreds to thousands of angstroms thick. Over this oxide, a layer 34 of heavily doped semiconductor material, preferably polysilicon, of one conductivity type is deposited by any conventional method. For simplicity, the conductivity type will be referred to as N-type, though it will be understood this layer could be P-type instead. It can be doped in situ or by implantation following deposition.

Figure 6B:
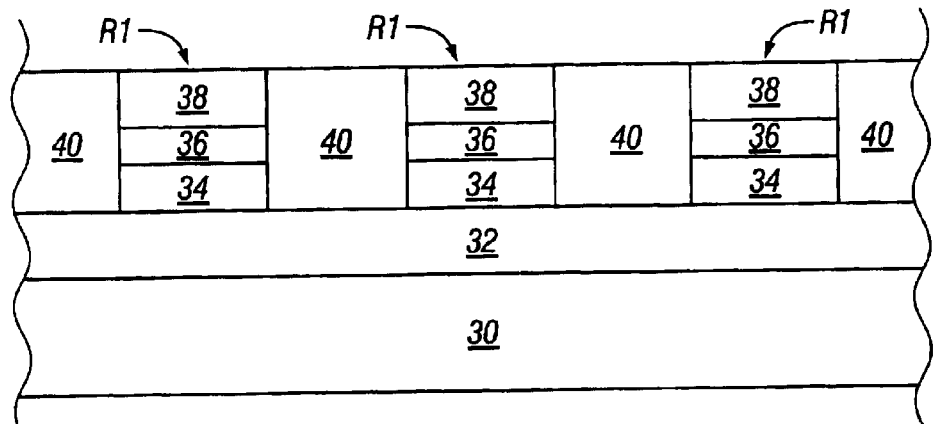

Over semiconducting layer 34, conductor layer 36 is deposited. This can be any metal, for example $TiSi_2/TiN$, Ti, W, Cu, Al, or alloys thereof. Over this another heavily doped semiconductor layer 38, preferably N-type polysilicon, is deposited. The heavily doped semiconductor layers 34 and 38 and the intervening conductive layer 36 are then patterned and etched to form substantially parallel rails R1, as shown in FIG. 6b. In this figure, the rails R1 are shown in cross-section. A dielectric material 40, preferably an oxide, is deposited over and between the rails R1, then planarized, preferably by chemical mechanical polishing (CMP) to expose the tops of the rails R1.

Next the amorphous or polycrystalline silicon layer 42 that will form the channel and the source and drain regions is deposited. Its final thickness should be 100 angstroms thick or less, preferably 80 angstroms thick or less, or more preferably 60 angstroms thick or less. If the tunnel oxide to be formed over amorphous or polycrystalline silicon layer 42 is thermally grown (discussed below), about 30 to 50 angstroms will be lost through subsequent oxidation, so deposition thickness should be adjusted accordingly. As in the embodiment described earlier, if the source and drain are to be $N^+$, and the as-deposited silicon tends to be slightly $N^-$, this layer may be deposited $P^-$ to counteract any unintentional doping.

Over this the tunnel dielectric 44 is created, preferably of thermally grown $SiO_2$ 20 to 30 angstroms thick. Over this the charge trapping layer 46, preferably 90 angstroms of nitride; and the blocking dielectric 48, preferably 60 angstroms of oxide, are formed. Both can be deposited by LPCVD.

Figure 6C:
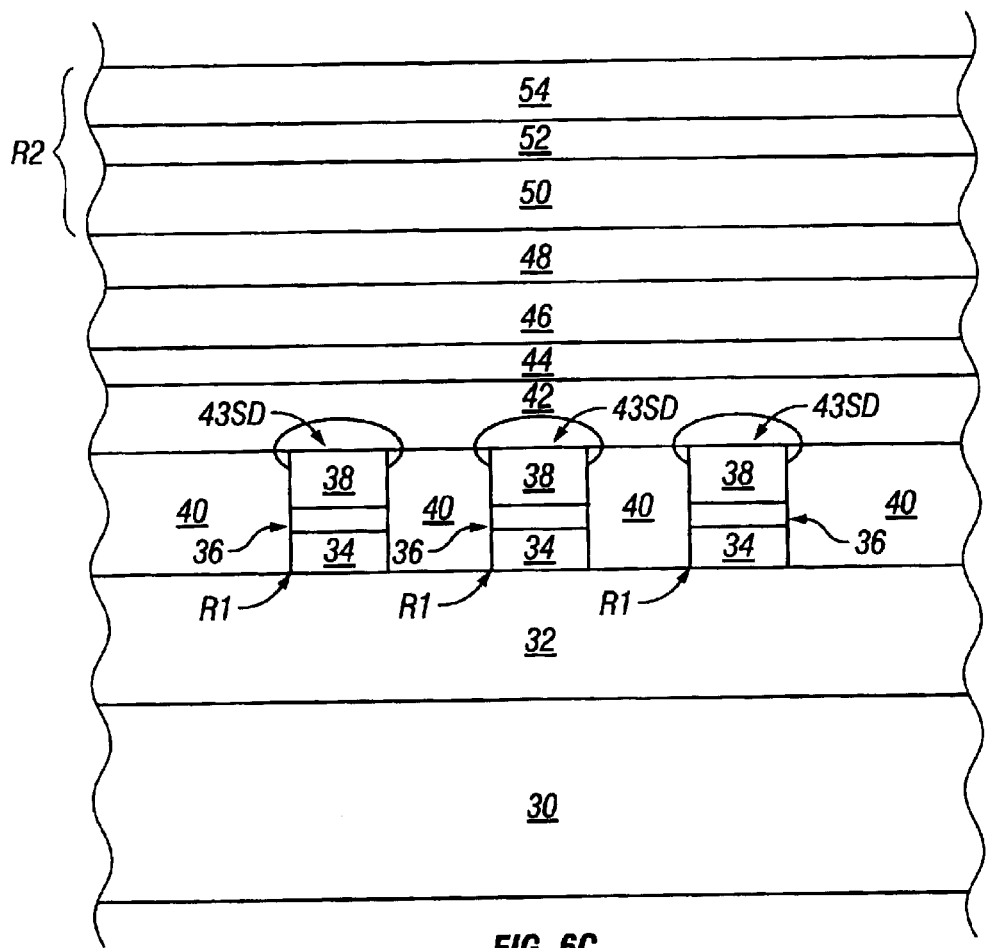

Next a layer of heavily doped semiconductor material 50, for example $P^+$ polysilicon, is deposited, followed by a conductive layer 52. This can be any conductive material, and can be the same conductive material used in conductive layer 36, or can be a different material. Over this another semiconductor layer 54, for example $P^+$ amorphous or polycrystalline silicon, is deposited. The semiconductor layers 50 and 54 and the intervening conductive layer 52 are then patterned and etched to form substantially parallel rails R2, which are substantially orthogonal to rails R1, as shown in FIG. 6c. A dielectric material, preferably an oxide (not shown), is deposited over and between the rails R2, then planarized, preferably by chemical mechanical polishing (CMP) to expose the tops of the rails R2.

Either an explicit anneal step or high temperatures from subsequent processing will crystalize the thin amorphous silicon layer 42 to polysilicon, creating a thin channel region, and will cause dopants in semiconductor layer 38 at the tops of rails R1 to diffuse upward creating source and drain regions 43SD in silicon layer 42. This method has been referred to as solid source diffusion.

Using N-type silicon for heavily doped semiconductor layer 38, doped with N-type dopants such as phosphorus, arsenic, and antimony, provides an advantage over using P-type silicon doped with boron. Doping of source and drain regions through solid source diffusion as just described is more controllable using N-type silicon, as these N-type dopants diffuse relatively slowly. Excessive diffusion will cause source and drain regions to become too large, and potentially to touch, causing a short. If care is taken to limit diffusion, however, P-type dopant can be used instead.

TFT memory devices with thin channels according to the present invention can be used in monolithic three dimensional memory arrays of the type described in Lee et al., U.S. patent application Ser. No. 09/927648, "Dense Arrays and Charge Storage Devices, and Methods for Making Same", filed on Aug. 13, 2001, and Scheuerlein et al., U.S. patent application titled "Programmable Memory Array Structure Incorporating Series-Connected Transistor Strings and Methods for Fabrication and Operation of Same," filed the same day as the present application, both of which are hereby incorporated by reference in their entirety.

Depletion mode SONOS transistors as described in Scheuerlein et al. can be made with extremely thin channels according to the present invention, as can monolithic three dimensional memories of such devices, which may include many thousands of TFTs. Extremely thin channels could provide additional advantages in depletion mode in that the depth of the depletion mode dopant profile becomes the same as the channel thickness and avoids that second control factor in the threshold of the depletion mode device.

It has been shown how reducing variability of threshold voltage $V_T$ is beneficial for TFT SONOS memory arrays. Clearly the same benefit would apply to any TFT memory array, as well, not just SONOS-type. In addition, the present invention can be used to advantage in any TFT circuit, including non-memory devices, in which it is beneficial to limit variability of threshold voltage across the circuit.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A thin film transistor comprising:
   a channel region wherein the channel region is 100 angstroms thick or less; and
   a charge storage region, wherein the transistor is a non-volatile memory cell, wherein the charge storage region comprises an oxide-nitride-oxide sandwich.

2. The thin film transistor of claim 1, wherein the charge storage region comprises silicon nitride.

3. The thin film transistor of claim 1, wherein the channel region is 80 angstroms thick or less.

4. The thin film transistor of claim 3, wherein the channel region is 60 angstroms thick or less.

5. A thin film transistor comprising:
   a channel region wherein the channel region is 100 angstroms thick or less; and
   a charge storage region, wherein the transistor is a non-volatile memory cell having a threshold voltage that is in depletion mode at least some of the time, wherein the charge storage region comprises an oxide-nitride-oxide sandwich.

6. The thin film transistor of claim 5, wherein the charge storage region comprises silicon nitride.

7. The thin film transistor of claim 5, wherein the channel region is 80 angstroms thick or less.

8. The thin film transistor of claim 7, wherein the channel region is 60 angstroms thick or less.

9. A thin film transistor comprising:
   a channel region wherein the channel region is 100 angstroms thick or less; and
   a charge storage region, wherein the transistor is a non-volatile memory cell, wherein the charge storage region comprises charge-trapping nanocrystals.

10. The thin film transistor of claim 1, further comprising a source and a drain, wherein dopants in said source and said drain are introduced by implantation.

11. The thin film transistor of claim 10, further comprising a charge storage region.

12. A thin film transistor comprising a channel region wherein the channel reman is 80 angstroms thick or less, further comprising a source and a drain, wherein dopants in said source and said drain are introduced through solid source diffusion.

13. The thin film transistor of claim 12, further comprising a charge storage region.

14. An array of thin film transistors wherein at least one of the transistors has a channel region 100 angstroms thick or less and wherein at least one of the transistors has a charge storage region and is a nonvolatile memory cell, wherein the array comprises a monolithic three dimensional memory array.

15. A set of thin film transistors over a substrate, the set comprising at least one thousand thin film transistors, wherein the threshold voltages of all of the thin film transistors fall within a range of 300 millivolts.

16. The set of claim 15, wherein the set is on a die.

17. The set of claim 16, wherein at least one of the thin film transistors on the die has a charge storage region.

18. The set of claim 17, wherein the charge storage region is an oxide-nitride-oxide sandwich.

19. The set of claim 17, wherein the charge storage region is a floating gate.

20. The set of claim 17, wherein the set comprises a monolithic three dimensional memory.

21. The set of claim 17, the transistor having a threshold voltage that is in depletion mode at least some of the time.

* * * * *